United States Patent [19]

Plesinger

[11] Patent Number: 4,767,104
[45] Date of Patent: Aug. 30, 1988

[54] NON-PRECIOUS METAL FURNACE WITH INERT GAS FIRING

[75] Inventor: Boris Plesinger, Scottsdale, Ariz.

[73] Assignee: Honeywell Bull Inc., Phoenix, Ariz.

[21] Appl. No.: 33,869

[22] Filed: Apr. 2, 1987

Related U.S. Application Data

[63] Continuation of Ser. No. 796,672, Nov. 6, 1985, abandoned.

[51] Int. Cl.$^4$ ................................................ C21B 7/22
[52] U.S. Cl. ..................................... 266/144; 266/108
[58] Field of Search ............... 266/144, 252, 108, 255, 266/257, 159; 75/5; 432/206, 200, 171, 164, 166

[56] References Cited

U.S. PATENT DOCUMENTS

| | | | |
|---|---|---|---|
| 2,849,222 | 8/1958 | Senger | 266/255 |
| 4,113,240 | 9/1978 | Klein | 266/252 |
| 4,337,083 | 6/1982 | Sweat | 75/5 |
| 4,395,025 | 7/1983 | Watanabe et al. | 266/257 |

*Primary Examiner*—John P. Sheehan
*Assistant Examiner*—S. Kastler
*Attorney, Agent, or Firm*—A. A. Sapelli; J. S. Solakian; E. W. Hughes

[57] ABSTRACT

A furnace for firing a non-precious metal paste including organic material, comprising a furnace enclosure, tube-like in shape, having a definable length. First and second ends of the furnace enclosure is open forming an entrance and exit, respectively. A cross-section across the length of the furnace enclosure has a flat base, a first and second vertical wall at each end of the flat base, and a roof, the shape of the roof being essentially the upper half of an ellipse. The interior chamber of the furnace is divided across the length of the furnace enclosure into a burnout zone and a firing zone, the entrance leading to the burnout zone, and the exit being nearest the firing zone. A sparging element distributes a mixture of an inert gas and at least one other gas within the burnout zone, wherein the other gas supports burnout of the organic material. A distributing element inserts an inert gas in the firing zone in the interior chamber of the furnace such that the non-precious metal is sintered in an inert atmosphere. A barrier element, providing a barrier such that the gas mixture of the burnout zone and the inert gas and the firing zone, are separated, thereby dividing the interior chamber of the furnace into the burnout zone and the firing zone. An exhaust means in the burnout zone where most smoke is produced as a result of the burnout of the organic material.

4 Claims, 4 Drawing Sheets

NON-PRECIOUS METAL FURNACE WITH INERT GAS FIRING

This is a continuation of co-pending application Ser. No. 796,672 filed on Nov. 6, 1985, now abandoned.

RELATED PATENT APPLICATION

The present patent application is related to U.S. patent application, Ser. No. 796,673 filed Nov. 8, 1885, entitled "Gas Distribution System", by Boris Plesinger et al, filed on even date herewith, and assigned to Honeywell Information Systems Inc., the assignee of the present application.

BACKGROUND OF THE INVENTION

This invention relates to a furnace, and more particularly, to a muffle furnace for firing multilayered ceramic carriers used to mount and interconnect a plurality of integrated circuit chips.

There currently exists furnaces for firing of precious metals, such as gold. The firing of precious metals can be accomplished in the presence of air (i.e., oxygen) since the precious metals will not oxidize, and atmosphere contaminants will not interfere with the firing of the precious metal. No furnace presently exists which has been designed specifically for the firing of thick film pastes of a non-precious metal, in which the film paste of a non-precious metal can also include an organic vehicle material, or binder. (The non-precious metal of the preferred embodiment being copper, which is used in the manufacturing processes of a multilayered substrate for mounting electronic circuit components.)

The industry has tried to use the aforementioned precious metal furnaces for firing of thick film paste of a non-precious metal with little success. Many problems have been encountered; specifically, there is an insufficient exhaust system to evacuate the gases from the burnout zone and there also exists an insufficient fresh gas distribution system in the burnout and firing zones. This is because the organic vehicle contained in the film paste generates substantial amounts of combustion products which needs to be evacuated. The existing furnaces have two exhaust stacks, one placed in the front end of the burnout zone immediately past the entrance curtains (which is essentially a cold zone) and the other located directly above the barrier separating the burnout zone from the firing zone. In existing furnaces, displacement of the burnout exhaust causes the burn off gas to flow against the substrate movement causing reduced microatmospheres above the substrates causing incomplete burnout and other problems such as reduced solderability and loss of adhesion, the substrate(s) being placed on a chain belt which moves through the furnace.

The firing of a thick film paste of a non-precious metal needs to be accomplished in an inert atmosphere. In order to burn off the organic vehicle, oxygen must be used otherwise the organic material carbonizes which can cause short circuits in the substrate. Thus, in the furnace of the present invention a mixture of nitrogen and oxygen is injected into the furnace, but a careful balance needs to exist to insure the non-precious metal (copper) is not oxidized. Another problem with the burn off of the organic material in the existing furnaces is a build up of a carbon residue in the furnace exhaust stack especially since the exhaust stack is in a relative cold zone. After a period of time, the carbon residue, a black tacky substance, starts dropping onto the substrates causing contamination, and thus causing the substrate to be rejected and which in turn requires regular cleaning of the furnace exhaust stack using the "chimney sweep" process, i.e., brushing the inside of the furnace exhaust stack with a large brush.

Thus, there exists a need for a furnace specifically designed for the firing of a thick film paste of a non-precious metal, wherein the film paste can also include an organic vehicle material.

SUMMARY OF THE INVENTION

Therefore, there is provided by the present invention a furnace for firing an element which contains a non-precious metal paste including organic material. The furnace comprises a furnace enclosure, being tube-like in shape having a definable length. A first and second end of the furnace enclosure is open forming an entrance and exit, respectively, and the volume enclosed by the furnace enclosure forms an interior chamber of the furnace. A cross-section across the length of the furnace enclosure has a flat base, a first and second vertical wall at each end of the flat base, and a roof, the shape of the roof being essentially the upper half of an ellipse. The interior chamber of the furnace is divided across the length of the furnace enclosure into a burnout zone and a firing zone, the entrance leading to the burnout zone, and the exit being nearest the firing zone. A sparging element distributes a mixture of an inert gas and at least one other gas within the burnout zone, wherein the other gas supports burnout of the organic material. The sparging element provides uniform coverage of the element with the mixture of the inert gas and the other gas and also reduces disruptive gas flow within the interior chamber of the furnace. A distributing element inserts an inert gas in the firing zone in the interior chamber of the furnace such that the non-precious metal is sintered in an inert atmosphere. A barrier element, inserted into the interior chamber of the furnace, provides a barrier such that the gas mixture of the burnout zone and the inert gas and the firing zone, are separated, thereby dividing the interior chamber of the furnace into the burnout zone and the firing zone. An exhaust element is placed in the roof of the furnace in an area of the burnout zone in which most smoke is produced as a result of the burnout of the organic material for removing the smoke from the burnout zone.

Accordingly, it is an object of the present invention to provide a furnace for firing non-precious metal paste in an inert gas.

It is still another object of the present invention to provide a furnace for firing a non-precious metal in an inert gas, wherein the non-precious metal paste includes an organic vehicle material.

These and other objects of the present invention will become more apparent when taken in conjunction with the following description and attached drawings, wherein like characters indicate like parts, and which drawings form a part of the present application.

DETAILED DESCRIPTION

Figure 1:
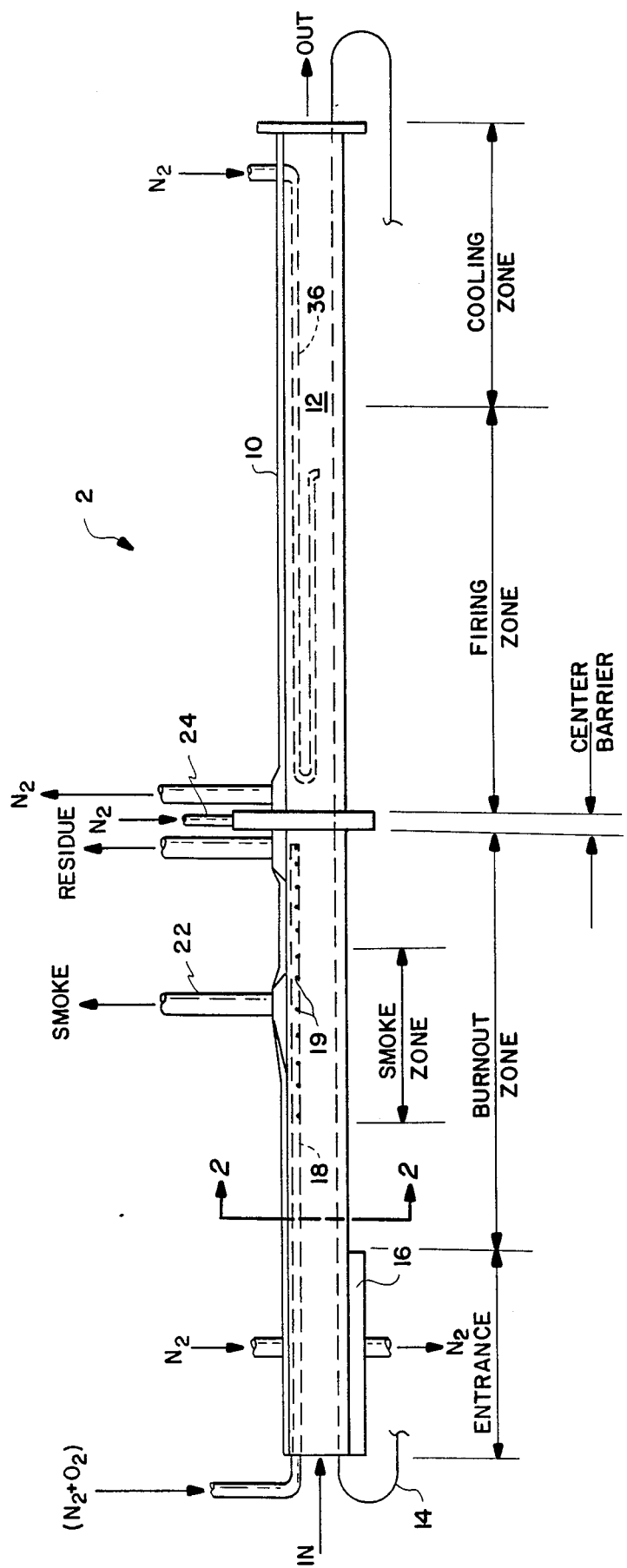
FIG. 1 shows an exterior view of the furnace of the present invention.

Referring to FIG. 1, there is shown an exterior view of a furnace enclosure 10, the enclosed area thereby defining an interior chamber 12. Ceramic substrates (not shown) to be fired are placed on a chain belt 14, which transports the ceramic substrate (not shown) through the interior chamber 12 of a furnace 2 from an input (IN), or entrance, of the furnace 2 to an output (OUT), or exit, of the furnace 2. The ceramic substrates can include a film paste of a non-precious metal having an organic vehicle material (the non-precious metal of the preferred embodiment being copper) and can also include a PPD (photo sensitive plastic material) which is an organic material. The furnace 2 is divided into various zones (or areas). Various zones of the furnace 2 will be described hereinunder following the ceramic substrate as it moves through the interior chamber 12 of the furnace 2.

Figure 1A:
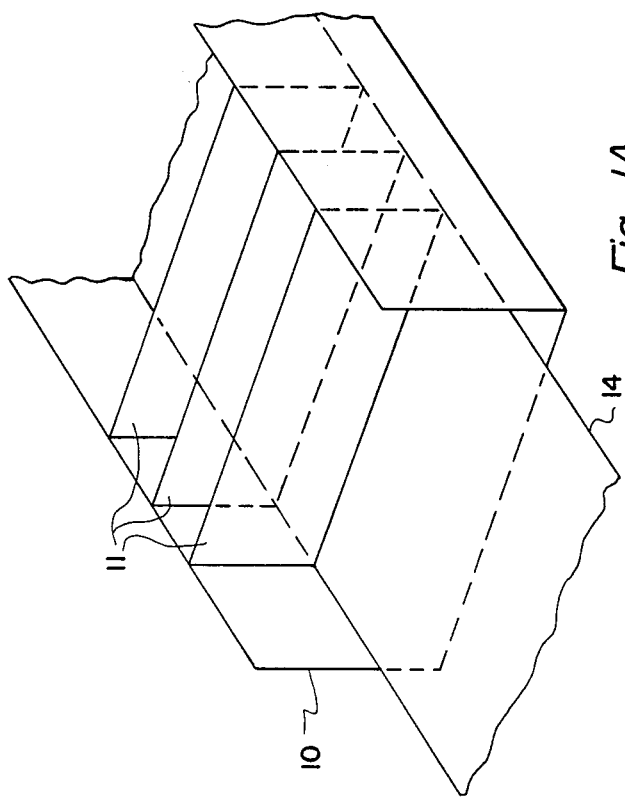
FIG. 1A shows a cut-away view of the entrance of the furnace showing the entrance curtain which covers the input to the furnace.

The ceramic substrate enters the interior chamber through an entrance area (vestibule) which is effectively a clean zone. The entrance area includes entrance curtains 11 (shown in FIG. 1A) which cover the opening of the interior chamber 12. The entrance curtains 11 hang from the upper part of the interior chamber 12 down to the chain belt 14, and are hinged at the top of the interior chamber 12 thereby enabling the ceramic substrate to move past the entrance curtains, the entrance curtains brushing the top surface of the ceramic substrate as it passes through. In addition, in the entrance area, nitrogen ($N_2$) gas (which can be preheated to avoid thermal shock to the substrate) is fed into the interior chamber 12 and extracted immediately below via an exit chamber 16 forming a nitrogen curtain. The purpose of this arrangement is to prevent the intake of ambient air into the interior chamber 12.

From the cleaning zone, the ceramic substrate moves to the burnout zone where the temperature within the interior chamber 12 begins to elevate. In the burnout zone, burnout of the organic material occurs. The portion of the interior chamber 12 in which essentially all the smoke is produced as a result of the burnout of the organic material is denoted as the smoke zone. Most of the burnout of the organic material occurs in the smoke zone (i.e., almost all of the smoke is generated in the smoke zone). This is a function of the temperature within the interior chamber 12. In the preferred embodiment, the burnout of the organic material occurs in an area of the interior chamber 12 where the temperature is between 350° to 500° centigrade (C.), hence the temperature of the smoke zone is within this range. The burnout occurs in the presence of a mixture of nitrogen ($N_2$) gas and oxygen ($O_2$). This gas mixture is fed into the interior chamber 12 by a sparger 18.

Figure 2:
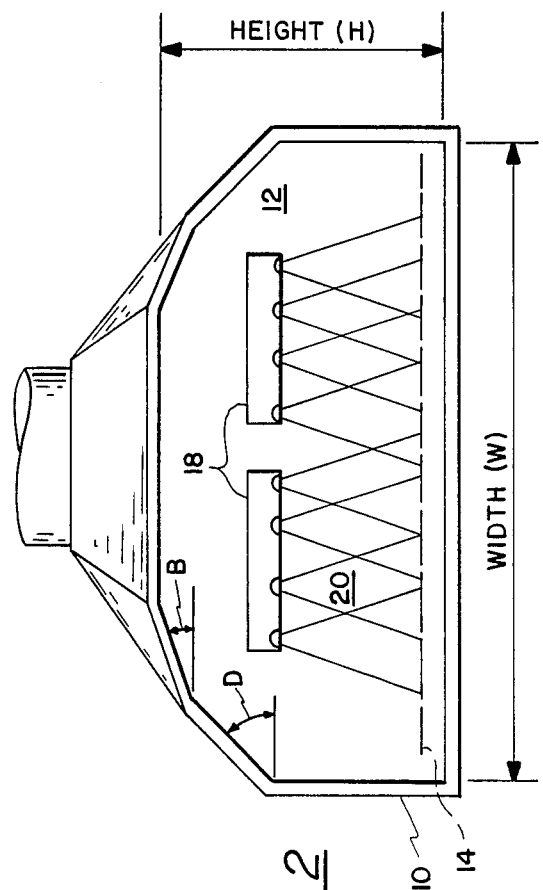
FIG. 2 shows an expanded cross-section view 2—2 of the furnace of FIG. 1.

The gas sparger 18 is a gas distribution device (or a gas spraying device) which sprays the nitrogen and oxygen gas mixture in a spray pattern 20 as shown in FIG. 2. FIG. 2 shows a cross section view 2—2 (expanded) of the furnace of FIG. 1. The gas sprayed provides uniform coverage of the ceramic substrate with the incoming nitrogen and oxygen gas mixture while reducing the disruptive gas flows within the interior chamber 12. This is a departure from existing gas sparges which are designed to cover the belt area. The gas sparger 18 is a dual tube delivering the gas through varying size slots throughout the burnout chamber. The size slots are calculated to provide uniform gas flow taking into consideration the velocity of the incoming gas and expansion as the gas is delivered towards the center barrier. The nitrogen and oxygen gas mixture is delivered via two tubes which extend through the burnout zone. The tubes open up in a rectangular chamber which distributes the gas across the chain belt 14 through the slots (or orifices) 19 on the underside of the rectangular tube surrounding the gas inlet tube. The details of a gas sparger which produce the desired spray pattern are more fully described in the related patent application mentioned above, and is incorporated by reference herein to the extent necessary for an understanding of the present invention. Referring back to FIG. 1, the inlet tube of the gas sparger 18 extends along the length of the interior chamber 12 from the burnout zone to the entrance (IN). By feeding the nitrogen and oxygen gas in this manner, the nitrogen gas (which is usually fed from frozen tanks) is preheated as it passes through the length of the furnace before it enters the interior chamber 12. The orifices 19 of the gas sparger 18 extends along the length of the gas sparger 18 from just before the smoke zone to the end of the burnout zone. The roof of the furnace along the smoke zone is funneled up to aid the exhaust flow upward and away from the substrate. An exhaust opening is provided in the roof of the furnace wall at the vertex of the funnel and includes a first stack 22 above the smoke zone thereby providing for evacuation of the smoke generated in the immediate area. Also, the first exhaust (or the smoke exhaust) stack 22 is at a relatively high temperature thus preventing condensation of any contaminants contained in the smoke such as the tacky tar-like substance.

The diameter of the stack is a function of the amount of smoke to be carried away or evacuated. This amount can be calculated analytically or determined empirically. All the stacks in the furnace of the preferred embodiment of the present invention are regulated exhausts, (although they need not be) the technique of regulating the exhaust can be by any one of the many techniques well known to those skilled in the art. The regulation of the stacks will aid in determining the gas flow in the interior chamber 12 of the furnace 2.

Referring to FIG. 2, a cross section of the furnace 2 is shown. The roof of the furnace 2 has a hipped configuration to improve gas flow patterns. This configuration causes less disruptive gas flows in conjunction with the gas sparger 18 distribution described above and promotes better exhaust gas flows. For the best exhaust flow, the ideal shape would be a rounded roof, specifically half of a cylindrical ellipsoid, or alternatively a portion of a circular cylinder rather than the rectangular shape of existing furnaces. Because of manufacturing difficulties, the "double hipped roof" was utilized in the preferred embodiment of the present invention. This shape is a compromise between the circular and elliptical cylinder and is relatively easy to manufacture. The dimensions are such that the roof lines are tangential to the periphery of an ellipse. In the preferred embodiment angle A is 45° and angle B is $22\frac{1}{2}°$. Although the preferred embodiment has a 1:2 aspect (i.e., the height (H) to the width (W)), this aspect is not required. What is important is that no dead spots or gas turbulence occurs and that the exhaust gasses flow away from the ceramic substrate.

Figure 3A:
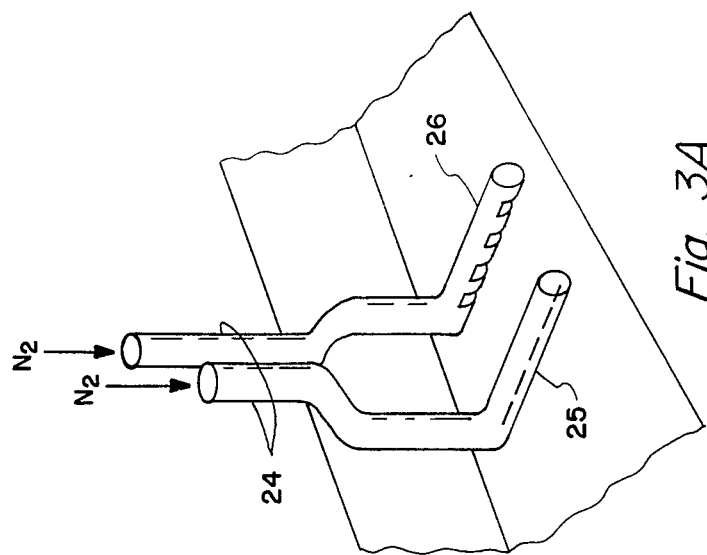
FIG. 3A shows a three dimensional view of the nitrogen gas distributor of the center barrier.
Figure 3B:
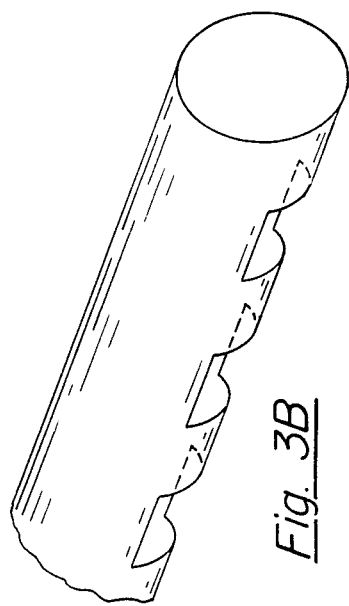
FIG. 3B shows the orifices of a portion of the nitrogen gas distributor of the center barrier of FIG. 3A.
Figure 3:
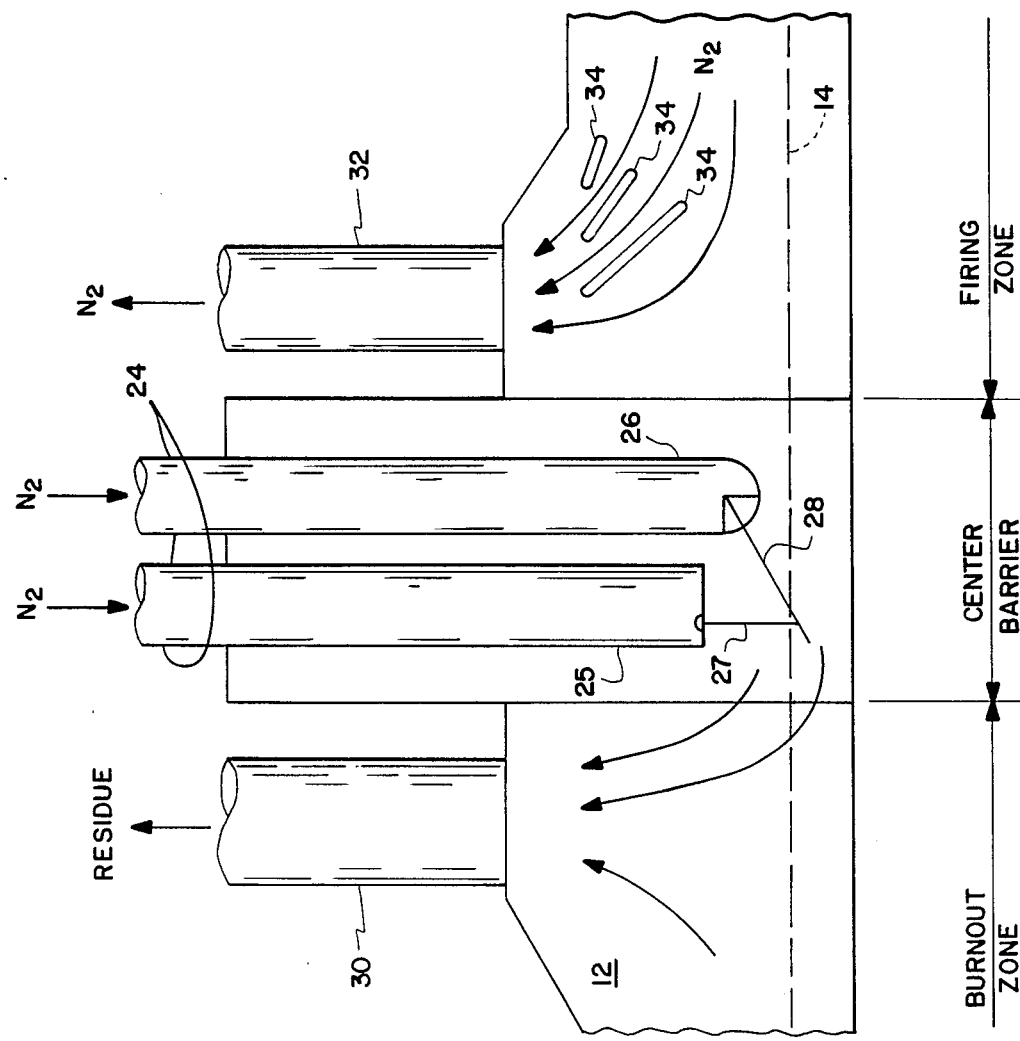
FIG. 3 shows an interior view of the center barrier area.

Before the ceramic substrates passes to the firing zone, the ceramic substrate passes a center barrier. Referring to FIG. 3 there is shown an interior view of the center barrier. The center barrier provides a spraying of nitrogen gas (perheated within) which removes any residue smoke trapped on or under the ceramic substrate. This is accomplished by providing a nitrogen gas distributor 24 having a first distributor 25 and a second distributor 26. The two distributors 25, 26 are separately supplied with the inert gas to control the gas flow within the interior chamber in order to provide the desired flow pattern. The first distributor provides a downward spray pattern 27 and the second distributor 26 provides a spray across the top and downward on the ceramic substrate having a resultant flow 28. The residue gases are extracted from a second stack, a residue exhaust stack 30, the arrowed lines showing the flow of the gases. Nitrogen gas which is inserted into the firing zone (as will be described hereinunder) is exhausted via a third stack, a nitrogen exhaust stack 32, and extracts the nitrogen inserted into the firing zone. This provides a barrier such that the firing zone is free of the nitrogen and oxygen gas mixture. Baffles 34 can be included at the entrance of the nitrogen exhaust stack 32 to achieve the desired flow of the nitrogen gas thereby creating the barrier. FIG. 3A shows the nitrogen gas distributor in a 3-D view in the interior chamber 12, and FIG. 3B shows the orifices of the second distributor 26 in greater detail.

Referring back to FIG. 1, as the ceramic substrate enters the firing zone, the non-precious metal and the dielectric is sintered. The sintering process is done in an inert gas atmosphere, provided by a second gas sparger 36 inserted into the firing zone. The second gas sparger 36 has an inlet for the nitrogen gas essentially at the output end of the furnace. The feeding device, a tube-like device, extends from the inlet along the total length of the cooling and firing zones, bends around, and then extends back towards the exit of the furnace and extends almost to the end of the firing zone, where the gas is allowed to enter into the interior chamber 12. This allows the nitrogen gas to be preheated by the high temperatures of the internal chamber 12, and thus requires no external preheating. The exit portion of the furnace also has a positive pressure of inert gas (although not specifically shown), such that the ambient air cannot enter the interior chamber 12. The total length of the furnace is given by the process of temperature/time of the materials.

Figure 4:
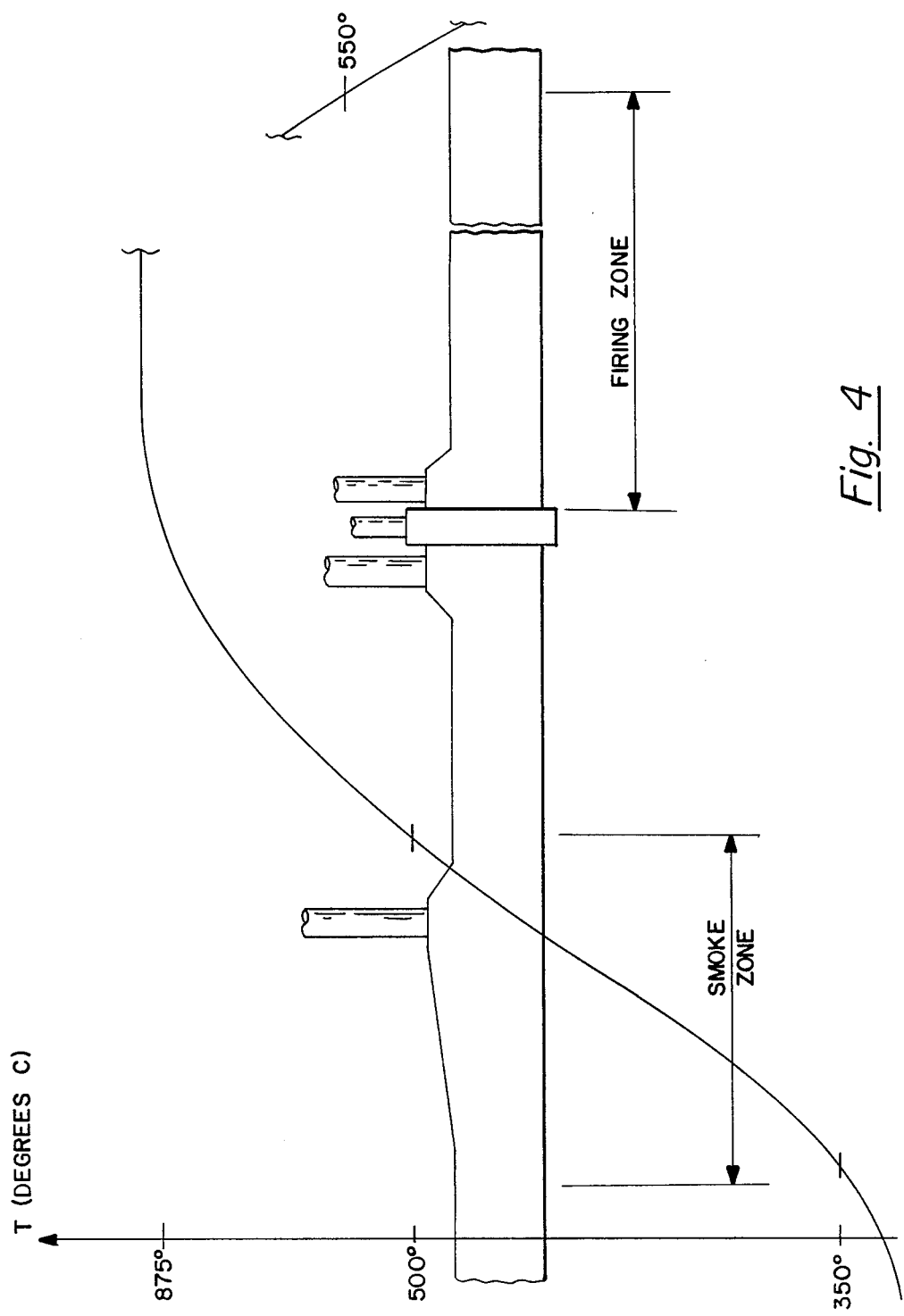
FIG. 4 shows the temperature profile through the length of the interior chamber of the furnace of the preferred embodiment.

Referring to FIG. 4, the temperature profile through the interior chamber 12 of the furnace 2 is shown for the preferred embodiment of the present invention.

While there has been shown what is considered the preferred embodiment of the present invention, it will be manifest that many changes and modifications can be made therein without departing from the essential spirit and scope of the invention. It is intended, therefore, in the annexed claims to cover all such changes and modifications which fall within the true scope of the invention.

We claim:

1. A furnace for firing substrates on which substrates have been placed a paste, said paste including a non-precious metal and an organic material, said furnace comprising:

a tube shaped furnace enclosure having a definable length and a pair of ends, the interior of the enclosure forming a chamber;

means forming in one end of the enclosure an entrance into the chamber, and means forming in the other end of the enclosure an exit from the chamber, said chamber being defined by a substantially horizontal base wall, first and second substantially vertical side walls and wall means connecting the first and second side walls and forming a roof of the chamber;

means forming a center barrier dividing the chamber into a first zone and a second zone, the first zone being in communication with the entrance to the chamber and the second zone being in communication with the exit, said means forming a center barrier preventing gases from the first zone substantially from entering the second zone;

means for sparging a mixture of an inert gas and oxygen within the burn-out zone, the oxygen supporting first of the organic material of the paste and further wherein said means for sparging provides uniform coverage of the substrates with the mixture of the inert gas and oxygen to reduce disruptive gas flow within the first zone;

means for inserting an inert gas in the second zone in the chamber so that the non-precious metal of the paste is sintered in an inert atmosphere;

first exhaust means being placed in the roof of the furnace in an area of the first zone in which most of the smoke is produced as a result of the burn-out of organic material, for removing said smoke from the first zone;

means for preventing ambient atmosphere from entering the chamber through the entrance, and means for preventing ambient atmosphere from entering the chamber through the exit;

second exhaust means for removing gases from said first zone proximate the means forming a center barrier; and third exhaust means for removing gases from the second zone located proximate the means forming a center barrier.

2. A furnace as defined in claim 1 in which a cross section of the roof perpendicular to the length of the furnace being substantially half of an ellipse.

3. A furnace for firing substances on which substrates have been placed a paste, said paste including a powdered non-precious metal and an organic binder material, said furnace comprising:

a tube shaped furnace enclosure having a definable length and a pair of ends, the interior of the enclosure forming a chamber;

means forming in one end of the enclosure an entrance into the chamber, and means forming in the other end of the enclosure an exit from the chamber, said chamber being defined by a plurality of substantially planar walls, said walls including a substantially horizontal base wall, first and second substantially vertical side walls and a plurality of interconnecting walls forming a roof, said interconnecting walls interconnecting the first and second side walls and being positioned so as to be substantially tangential to the periphery of a cylindrical ellipsoid;

means forming a center barrier dividing the chamber into a first zone and a second zone, the first zone being in communication with the entrance to the chamber and the second zone being in communication with the exit, said means forming a center barrier forming an inert gas curtain between the first zone and the second zone so that gases from the first zone substantially are prevented from entering the second zone;

means for sparging a mixture of an inert gas and oxygen within the first zone, the oxygen supporting burn-out of the organic material of the paste and further wherein said means for sparging provides uniform coverage of the substrates with the mixture of the inert gas and oxygen to reduce distruptive gas flow within the burn-out zone;

means for inserting an inert gas in the second zone in the chamber so that the non-precious metal of the paste is sintered in an inert atmosphere;

first exhaust means being placed in the roof of the furnace in an area of the first zone in which most of the smoke is produced as a result of the burn-out of organic material, for removing said smoke from the first zone;

an inert gas curtain for preventing ambient atmosphere from entering the chamber through the entrance and an inert gas curtain for preventing ambient atmosphere from entering the chamber through the exit;

second exhaust means for removing gases from said first zone proximate the means forming a center barrier; and third exhaust means for removing gases from the second zone located proximate the means forming a center barrier.

4. A furnace for firing ceramic substrates on which substrates have been placed a thick film paste, said paste including powdered copper and an organic binder material, said furnace comprising:

a tube shaped furnace enclosure having a definable length and a pair of ends, the interior of the enclosure forming a chamber;

means forming in one end of the enclosure an entrance into the chamber, and means forming in the other end of the enclosure an exit from the chamber, said chamber being defined by a plurality of substantially planar walls, said walls including a substantially horizontal base wall, first and second substantially vertical side walls, a substantially horizontal top wall, and two sets of connecting walls each set of connecting walls including a first connecting wall and a second connecting wall, each set of connecting walls connecting a side wall to the top wall, the angle between the top wall and the first connecting wall of each set connected to the top wall defining an angle of substantially $22\frac{1}{2}°$ and the second connecting wall of each set connecting a side wall and a first connecting wall of each set defining an angle of substantially 45° with respect to the horizontal;

means for preventing ambient atmosphere from entering the chamber;

means forming a center barrier dividing the chamber into a burn-out zone and a firing and cooling zone, the burn-out zone being in communication with the entrance to the chamber and the firing and cooling zone being in communication with the exit, said means forming a center barrier forming a nitrogen curtain between the burn-out zone and the firing zone so that gases from the burn-out zone substantially are prevented from entering the firing and cooling zone;

means for sparging a mixture of nitrogen and oxygen within the burn-out zone, the oxygen supporting burn-out of the organic material of the paste and further wherein said means for sparging provides uniform coverage of the substrates with the mixture of the nitrogen and oxygen to reduce distruptive gas flow within the burn-out zone;

means for inserting nitrogen in the firing zone in the chamber so that the copper of the paste is sintered in an inert atmosphere;

first exhaust means being mounted in the top wall in an area of the burn-out zone in which most of the smoke is produced as a result of the burn-out of the organic material, for removing said smoke from the burn-out zone;

second exhaust means mounted in the top wall in the burnout zone near said means forming a center barrier for removing gases from the burn-out zone; and third exhaust means mounted in the top wall in the firing and cooling zone near said means forming a center barrier for removing gases from the firing and cooling zone.

* * * * *